(12) United States Patent
Han et al.

(10) Patent No.: US 7,755,181 B2
(45) Date of Patent: Jul. 13, 2010

(54) IC PACKAGE AND METHOD OF MANUFACTURING THE SAME

(75) Inventors: Hyun Joo Han, Suwon-si (KR); Tae Sang Park, Seoul (KR); Se Yeong Jang, Yongin-si (KR); Young Jun Moon, Suwon-si (KR); Jung Hyeon Kim, Hwaseong-si (KR); Sung Wook Kang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 134 days.

(21) Appl. No.: 11/872,810

(22) Filed: Oct. 16, 2007

(65) Prior Publication Data

US 2008/0157326 A1    Jul. 3, 2008

(30) Foreign Application Priority Data

Jan. 3, 2007    (KR) ...................... 10-2007-0000675

(51) Int. Cl.
*H01L 23/538*    (2006.01)
(52) U.S. Cl. ............... 257/686; 257/685; 257/E23.172; 438/107; 438/109
(58) Field of Classification Search ............... 257/685, 257/686, 723; 438/109, 107
See application file for complete search history.

(56) References Cited

U.S. PATENT DOCUMENTS

| 5,275,330 | A | * | 1/1994 | Isaacs et al. ............ 228/180.21 |
| 6,297,141 | B1 | * | 10/2001 | Miyazaki ..................... 438/612 |
| 6,861,750 | B2 | | 3/2005 | Zhao et al. |
| 2006/0220230 | A1 | * | 10/2006 | Tanaka et al. ............... 257/723 |

OTHER PUBLICATIONS

CN Office Action issued Mar. 6, 2009 in Chinese Application No. 200710166643.3.

* cited by examiner

*Primary Examiner*—Thinh T Nguyen
(74) *Attorney, Agent, or Firm*—Stanzione & Kim, LLP

(57) ABSTRACT

An IC package including a plurality of BGA IC packages stacked on a printed circuit board and a method of manufacturing the same. The IC package includes a printed circuit board, a first BGA IC package, having a plurality of first solder balls, stacked on the printed circuit board, a second BGA IC package, having a plurality of second solder balls, stacked on the first BGA IC package, and an interposer having a plurality of through-holes, which are filled by the second solder balls in a molten state such that the length of the second solder balls increases while the second solder balls harden, the interposer being joined to the top of the first BGA IC package.

9 Claims, 5 Drawing Sheets

IC PACKAGE AND METHOD OF MANUFACTURING THE SAME

CROSS-REFERENCE TO RELATED APPLICATIONS

This application claims the benefit of Korean Patent Application No. 2007-000675, filed on Jan. 3, 2007 in the Korean Intellectual Property Office, the disclosure of which is incorporated herein by reference in its entirety.

BACKGROUND OF THE INVENTION

1. Field of the Invention

The present general inventive concept relates to an integrated circuit (IC) package including a plurality of ball grid array (BGA) IC packages stacked on a printed circuit board (PCB), and a method of manufacturing the same.

2. Description of the Related Art

Recently, mobile products, such as mobile phones, personal digital assistants (PDA), and portable multimedia players, have gradually decreased in weight and size. At the same time, the functionality and speed of the mobile products have increased.

In order to accomplish high functionality and speed of mobile products using a single IC package, however, the development of such an IC package with such high functionality and speed is needed, which requires plenty of time and costs to manufacture.

Consequently, there has been proposed an IC package mount structure in which a plurality of IC packages or passive devices are assembled into a single package without an increase in area of a printed circuit board on which the IC package is mounted.

An example of this type of mount structure is constructed by stacking a plurality of BGA IC packages on a PCB.

FIG. 1 illustrates an IC package constructed by stacking two BGA IC packages.

As illustrated in FIG. 1, two BGA IC packages 110 and 120 are mounted as a stack on a printed circuit board 100. Specifically, the second BGA IC package 120 is joined to the first BGA IC package 110 such that the second BGA IC package 120 is stacked on the first BGA IC package 110 to manufacture a combined IC package 130. The IC package 130 is mounted on the printed circuit board 100 using surface mount technology.

At this time, it is needed to secure the space and height of a molded part of the first BGA IC package 110 located below the second BGA IC package 120, in which an IC chip 115 is molded with synthetic resin 116, and therefore, it is necessary for solder balls 121 of the second BGA IC package 120 located above the first BGA IC package 110 to have a size greater than solder balls 111 of the first BGA IC package 110.

When heat is applied to the combined IC package 130, manufactured by stacking the different BGA IC packages 110 and 120 on the printed circuit board 100, however, stress is generated at the solder balls 121 joining the stacked packages due to a difference in thermal expansivity between the printed circuit board 100 and the first and second BGA IC packages 110 and 120.

Since the size of the solder balls 121 of the second BGA IC package 120 is greater than that of the solder balls 111 of the first BGA IC package 110, the stress generated due to the difference in thermal expansivity is concentrated on the solder balls 121 of the second BGA IC package 120. As a result, the reliability of the IC package is lower.

SUMMARY OF THE INVENTION

The present general inventive concept provides an IC package including a plurality of BGA IC packages mounted as a stack on a printed circuit board wherein the diameter of solder balls of the upper BGA IC package is decreased, while a space for a molded part of a lower BGA IC package is secured, whereby stress is prevented from being concentrated on the solder balls of an upper BGA IC package.

Additional aspects and/or advantages of the invention will be set forth in part in the description which follows and, in part, will be obvious from the description, or may be learned by practice of the invention.

The foregoing and/or other aspects and utilities of the present general inventive concept may be achieved by providing an IC package including a printed circuit board, a first BGA IC package, having a plurality of first solder balls, stacked on the printed circuit board, a second BGA IC package, having a plurality of second solder balls, stacked on the first BGA IC package, and an interposer having a plurality of through-holes, which are filled by the second solder balls in a molten state such that the length of the second solder balls increases while the second solder balls harden, the interposer being joined to the top of the first BGA IC package.

Metal, such as gold, copper, or nickel, can be applied to inner circumferential surfaces of the through-holes of the interposer.

An alloy having the same components as an alloy constituting the second solder balls may be applied to inner circumferential surfaces of the through-holes of the interposer.

The through-holes can have a diameter less than or equal to that of the second solder balls.

The foregoing and/or other aspects and utilities of the present general inventive concept may also be achieved by providing a method of manufacturing an IC package, including mounting a first BGA IC package having a plurality of first solder balls on a printed circuit board, mounting an interposer having a plurality of through-holes on the first BGA IC package, mounting a second BGA IC package having a plurality of second solder balls on the interposer, and passing the printed circuit board, the first BGA IC package, the interposer, and the second BGA IC package through a heating furnace to melt the solder balls of the first BGA IC package such that the first BGA IC package is joined to the printed circuit board and to melt the solder balls of the second BGA IC package such that the through-holes of the interposer are filled with the solder balls of the second BGA IC package, whereby the second BGA IC package is joined to the first BGA IC package.

The method may further include applying flux to the top of the first BGA IC package.

The foregoing and/or other aspects and utilities of the present general inventive concept may also be achieved by providing an IC package comprising: a printed circuit board; at least two BGA IC packages stacked on each other and each having a plurality of solder balls, the at least two BGA IC packages being stacked on the printed circuit board at the lowermost package; and an interposer disposed between each of the at least two BGA IC packages and having a plurality of through-holes filled by the solder balls of the BGA IC package there above in a molten state such that the length of the solder balls increases while the solder balls harden, each interposer being joined to a top surface of one of the at least two BGA IC packages.

The foregoing and/or other aspects and utilities of the present general inventive concept may also be achieved by providing a method of manufacturing an IC package, comprising: mounting a first BGA IC package having a plurality of first solder balls on a printed circuit board; stacking at least one additional BGA IC package having a plurality of solder balls consecutively on the first BGA IC package; placing an interposer having a plurality of through-holes between each pair of the stacked BGA IC packages; and passing the printed circuit board, the BGA IC packages and the interposer through a heating furnace to melt the solder balls of each of the BGA IC packages such that the first BGA IC package is joined to the printed circuit board and to melt the solder balls of the other BGA IC packages such that the through-holes of the interposer are filled with the solder balls of the BGA IC package there above, whereby each pair of BGA IC packages become joined together.

The foregoing and/or other aspects and utilities of the present general inventive concept may also be achieved by providing a method of manufacturing an IC package, comprising: stacking plural BGA IC packages, each having a plurality of solder balls, above one another; placing an interposer having a plurality of through-holes therein between each of the BGA IC packages such that the through-holes align with the solder balls above the through-holes; and passing the BGA IC packages and the respective interposers through a heating furnace to melt the solder balls of each of the BGA IC packages such that the solder balls of the BGA IC package above each interposer melts through the through-holes and are brought into contact with circuit patterns of the BGC IC package below the respective interposer such that each pair of BGA IC packages become joined together.

BRIEF DESCRIPTION OF THE DRAWINGS

These and/or other aspects and utilities of the present general inventive concept will become apparent and more readily appreciated from the following description of the embodiments, taken in conjunction with the accompanying drawings, of which.

DETAILED DESCRIPTION OF THE PREFERRED EMBODIMENTS

Figure 1:
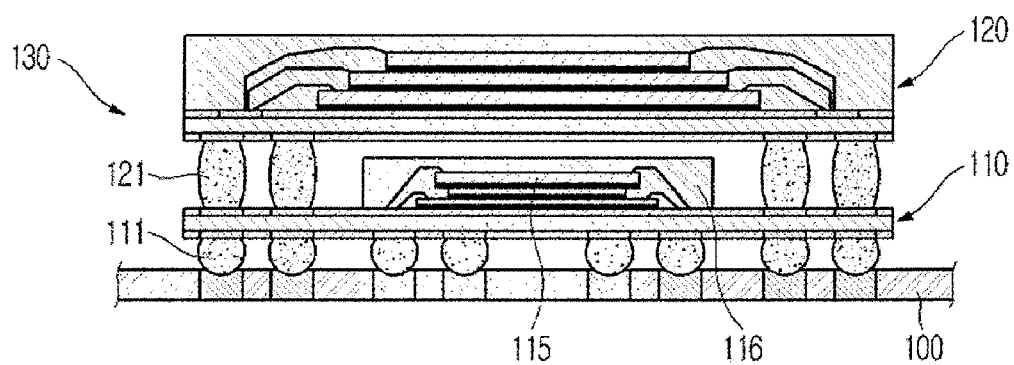
FIG. 1 is a sectional view illustrating a conventional IC package.

Reference will now be made in detail to the embodiment of the present general inventive concept, examples of which are illustrated in the accompanying drawings, wherein like reference numerals refer to like elements throughout. The embodiment is described below to explain the present general inventive concept by referring to the figures.

Figure 2:
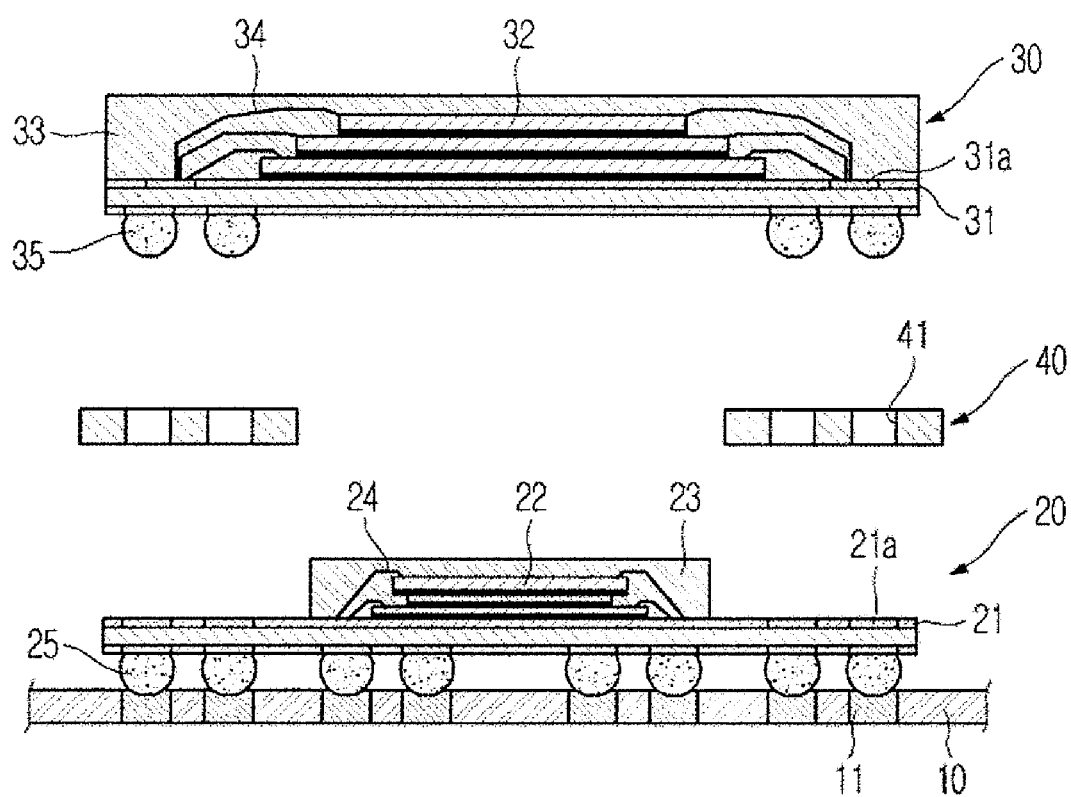
FIG. 2 is a sectional view illustrating an IC package according to an embodiment of the present general inventive concept before joining.

As illustrated in FIG. 2, an IC package according to an embodiment of the present general inventive concept includes a printed circuit board 10, a first BGA IC package 20 joined to a top portion of the printed circuit board 10, a second BGA IC package 30 stacked on the first BGA IC package 20, and an interposer 40 interposed between the first BGA IC package 20 and the second BGA IC package 30.

On the printed circuit board 10 is formed a circuit pattern 11, which is circuitly connected to the first and second BGA IC packages 20 and 30.

The first and second BGA IC packages 20 and 30 respectively include printed circuit boards 21 and 31 having circuit patterns 21a and 31a printed thereon, IC chips 22 and 32 attached to middle parts of the printed circuit boards 21 and 31, respectively, compound resin materials 23 and 33 surrounding the IC chips 22 and 32, respectively, and wires 24 and 34 to connect the IC chips 22 and 32 and the circuit patterns 21a and 31a respectively.

At a bottom portion of the first printed circuit board 21 are provided a plurality of first solder balls 25, by which the first BGA IC package 20 is circuitly connected to the circuit pattern 11 of the printed circuit board 10. At a bottom portion of the second printed circuit board 31 are provided a plurality of second solder balls 35, by which the second BGA IC package 30 is circuitly connected to the circuit pattern 21a of the first BGA IC package 20. The solder balls 25 and 35 can be made of an alloy of either tin and lead or tin, silver, and copper, and are consequently joined by soldering.

On the other hand, the second solder balls 35 of the second BGA IC package 30 have a diameter equal to that of the first solder balls 25 of the first BGA IC package 20. That is, there is no necessity for the second solder balls 35 to be excessively larger than the first solder balls 25, unlike the conventional IC packaged.

The interposer 40 is interposed between the first BGA IC package 20 and the second BGA IC package 30. The Interposer 40 has a plurality of through-holes 41 through which the solder balls 35 of the second BGA IC package 30 are inserted. The diameter of the through-holes 41 is less than or equal to that of the second solder balls 35. Gold (Au), copper (Cu), nickel (Ni), or an alloy having the same components as the alloy constituting the second solder balls 35 is applied to the inner circumferential surface of each through-hole 41.

Figure 3:
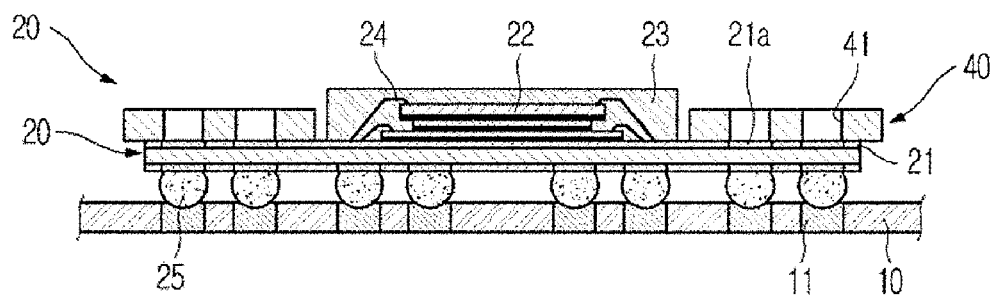
FIG. 3 is a sectional view illustrating an interposer joined to the top of a first BGA IC package.

As illustrated in FIG. 3, the first BGA IC package 20, having the solder balls 25, is mounted on the printed circuit board 10. Subsequently, flux is applied to the top of the first BGA IC package 20.

Consequently, when the second BGA IC package 30 is joined to the first BGA IC package 20, an oxide film is removed from the joined surface by the flux applied to the top of the first BGA IC package 20. A chloride, a fluoride, or a resin may be used as the flux.

After the first BGA IC package 20 is attached to the printed circuit board 10, the interposer 40 is mounted on the first BGA IC package 20. At this time, the through holes 41 of the interposer 40 are aligned with the circuit pattern 21a of the first BGA IC package 20.

Figure 4:
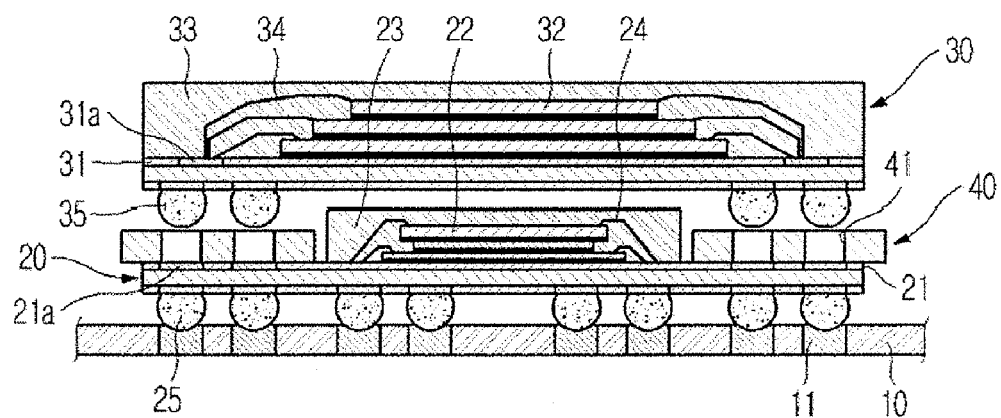
FIG. 4 is a sectional view illustrating a second BGA IC package before the second BGA IC package is joined to the top of the first BGA IC package.
Figure 5:
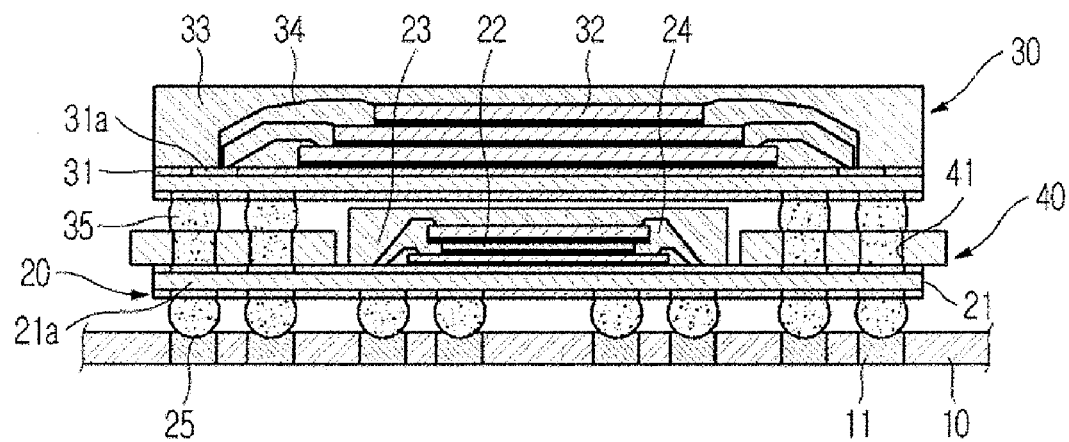
FIG. 5 is a sectional view illustrating solder balls of the second BGA IC package inserted, in a molten state, in through-holes of the interposer.

After the interposer 40 is attached to the first BGA IC package 20, the second BGA IC package 30 is mounted on the interposer 40, as illustrated in FIG. 4. At this time, to align the second solder balls 35 are aligned with the through-holes 41 of the interposer 40.

When the printed circuit board 10, the first BGA IC package 20, the interposer 40, and the second BGA IC package 30 are passed through a heating furnace, the first BGA IC package 20 is joined to the printed circuit board 10, and, at the same time, the second solder balls 35 of the second BGA IC package 30 melt and fill in the through-holes 41 of the interposer 40. As a result, the second solder balls 35 are brought into contact with the circuit pattern 21a of the first BGA IC package 20, whereby the first BGA IC package 20 and the second BGA IC package 30 are circuitly connected with each other.

Although the first BGA IC package 20 and the second BGA IC package 30 are circuitly connected with each other, it is possible for the two stacked BGA IC packages 20 and 30 to perform their respective functions as independent components before the stacking. For example, when the first BGA IC package 20 is a logic IC, and the second BGA IC package 30 is a memory IC, it is possible for the combined IC package to simultaneously perform logic and memory functions with an area occupied by a single BGA IC package on the printed circuit board 10.

Since the first BGA IC package 20 and the second BGA IC package 30 are connected with each other via the interposer 40 as described above, it is possible to reduce the diameter of the second solder balls 35 of the second BGA IC package 30. Since the diameter of the second solder balls 35 is reduced, heat stress is prevented from being concentrated on the second solder balls 35.

In the above description, the two BGA IC packages 20 and 30 are stacked one on another. However, the interposer 40 described herein is not limited to the above-described embodiment, and therefore, the interposer 40 may be used in a structure in which two or more BGA IC packages are stacked without limit.

For example, DRAM and flash memory ICs may be further stacked on the second BGA IC package 30, which is stacked on the first BGA IC package 20 as described above.

As apparent from the above description, the IC package according to the embodiments uses an interposer, and therefore, it is possible to reduce a size of solder balls formed at one BGA IC package stacked on another BGA IC package.

Consequently, stress is prevented from being concentrated on the solder balls of the upper BGA IC package, whereby the reliability of IC package products is guaranteed.

Although a few embodiments of the present general inventive concept have been shown and described, it would be appreciated by those skilled in the art that changes may be made in this embodiment without departing from the principles and spirit of the general inventive concept, the scope of which is defined in the claims and their equivalents.

What is claimed is:

1. An IC package comprising:
   a printed circuit board;
   a first BGA IC package, having a plurality of first solder balls, stacked on the printed circuit board;
   a second BGA IC package, having a plurality of second solder balls, stacked on the first BGA IC package; and
   an interposer having a plurality of through-holes, the interposer being joined to the top of the first BGA IC package,
   wherein the second solder balls are directly connecting between the first BGA IC package and the second BGA IC package when the second balls are melt and filled in the through-holes.

2. The IC package according to claim 1, wherein metal, such as gold, copper, or nickel, is applied to inner circumferential surfaces of the through-holes of the interposer.

3. The IC package according to claim 1, wherein an alloy having the same components as an alloy constituting the second solder balls is applied to inner circumferential surfaces of the through-holes of the interposer.

4. The IC package according to claim 1, wherein the through-holes have a diameter less than or equal to that of the second solder balls.

5. The IC package according to claim 1, wherein the first solder balls and the second solder balls have the same diameter.

6. An IC package comprising:
   a printed circuit board;
   at least two BGA IC packages stacked on each other and each having a plurality of solder balls, the at least two BGA IC packages being stacked on the printed circuit board at the lower most package; and
   an interposer disposed between each of the at least two BGA IC packages and having a plurality of through-holes, each interposer being joined to a top surface of one of the at least two BGA IC packages,
   wherein the at least one of solder balls is directly connecting between the first BGA IC package and the second BGA IC package when the at least one solder ball is melt and filled in the at least one of the through-holes.

7. The IC package according to claim 6, wherein when each BGA IC package is joined together via a respective interposer.

8. The IC package according to claim 1, wherein the second solder balls are contacted with the circuit pattern of the first BGA IC package.

9. The IC package according to claim 6, wherein the at least one of the solder balls is contacted with the circuit patterns of the at least two BGA IC packages.

* * * * *